United States Patent [19]

Foltz

[11] 3,835,337

[45] Sept. 10, 1974

[54] BINARY UNIVERSAL FLIP-FLOP EMPLOYING COMPLEMENTARY INSULATED GATE FIELD EFFECT TRANSISTORS

[75] Inventor: James W. Foltz, Scottsdale, Ariz.

[73] Assignee: Motorola, Inc., Chicago, Ill.

[22] Filed: July 20, 1973

[21] Appl. No.: 381,056

[52] U.S. Cl. ............. 307/279, 307/225 C, 307/269, 307/288, 328/48

[51] Int. Cl. .... H03k 3/286, H03k 3/33, H03k 21/00

[58] Field of Search ............ 307/220 R, 220 C, 269, 307/225 R, 225 C, 279, 288; 328/39, 48, 92, 94

[56] References Cited

UNITED STATES PATENTS

| | | | |
|---|---|---|---|
| 3,578,984 | 5/1971 | Ryley | 307/221 C |
| 3,619,644 | 11/1971 | Vittoz | 307/225 C |
| 3,656,010 | 4/1972 | Huyben et al. | 307/225 C X |
| 3,679,913 | 7/1972 | Foltz | 307/225 C X |
| 3,753,009 | 8/1973 | Clapper | 307/215 X |

*Primary Examiner*—Rudolph V. Rolinec
*Assistant Examiner*—L. N. Anagnos
*Attorney, Agent, or Firm*—Mueller, Aichele & Ptak

[57] ABSTRACT

A universal J-K flip-flop is implemented with insulated gate field effect transistors of both P and N channel types. The transistors are interconnected as a plurality of AND gates and NOR gates, with some transistors serving a dual function in both the master and slave portions of the flip-flop. A provision for direct set and reset of the flip-flop also is included.

11 Claims, 5 Drawing Figures

BINARY UNIVERSAL FLIP-FLOP EMPLOYING COMPLEMENTARY INSULATED GATE FIELD EFFECT TRANSISTORS

BACKGROUND OF THE INVENTION

In digital systems it is desirable to utilize bistable memory elements which change state each time an input excitation is applied or which assume the state represented by a binary input signal upon the application of a toggle or trigger pulse to the memory elements. This type of element is called a flip-flop. When such a flip-flop changes state each time an input excitation is applied, it is designated a toggle flip-flop and when it assumes a state representative of an input binary signal it is commonly referred to as a J-K flip-flop. A J-K flip-flop can be operated as a toggle flip-flop when both of its J and K binary inputs are the same.

Bistable flip-flops are useful in many of the components of digital systems, such as counters, multiplexers, memories, shift registers, and others.

Prior art circuitry has achieved the flip-flop function generally through the use of a number of bipolar transistors in cross-coupled configurations in addition to several resistive and capacitive components. While such circuits perform the desired flip-flop function, they, however, consume current from the power source during the quiescent state as well as during the switching state. As digital systems become more critical of power dissipation and in particular as more digital systems demand battery operation, this becomes a serious drawback.

As a solution to this problem inherent in bipolar transistor circuitry, digital circuitry designs for application in these areas has begun to convert to the use of insulated gate field effect transistors. Insulated gate field effect transistors are useful mainly because they do not require a current drive to cause them to conduct as bipolar devices do, but rather are voltage controlled devices. Insulated gate field effect transistors also are appealing because they eliminate the requirement of resistive and capacitive components.

Insulated gate field effect transistor flip-flop circuits have been designed which achieve the desired operative function, using devices of one conduction type and also using devices of both conduction types in the same circuit. Circuits of the first type still consume some current in the quiescent state. However, circuits using complementary insulated gate field effect transistors can be designed to have zero power consumption in the quiescent state and extremely low power consumption during switching. The resulting power consumption becomes dependent upon circuit mode capacitances and hence on the number of devices required. Thus, it is desirable to minimize the number of devices to the greatest extent possible.

In addition, prior art circuits using complementary insulated gate field effect transistors also have demanded specially timed control signals; have depended upon a specific value or range of values of some of the device parameters for their operation, or have several gate delays or switching delays between the application of input signals and the obtaining of output signals when such circuits are operated as a toggle flip-flop.

SUMMARY OF THE INVENTION

Accordingly, it is an object of this invention to provide and include master/slave flip-flop circuit.

It is an additional object of this invention to provide an improved master/slave flip-flop circuit which operates with extremely low power consumption.

It is a further object of this invention to provide an improved master/slave flip-flop circuit using complementary insulated gate field effect transistors.

It is another object of this invention to provide a new and improved universal or J-K flip-flop circuit which is comprised solely of transistors and which can be readily integrated.

In accordance with a preferred embodiment of this invention, a binary master/slave flip-flop operable as a J-K flip-flop or as a toggle flip-flop is implemented by a combination of AND gates and NOR gates arranged in master and slave sections. The specific circuit uses insulated gate field effect transistors of both conductivity types (complementary insulated gate field effect transistors), and there is sharing of functions between some transistors which are employed in a dual capacity in both the master and slave sections. This results in a reduction in the number of transistors required for the complete flip-flop circuit.

The circuit arrangement is such that minimum operating power is required, and zero power consumption exists in the quiescent or stable states of operation of the circuit. Additional gates permit asynchronous or direct setting and resetting of the flip-flop, irrespective of the state of input signals on the J and K inputs of the flip-flop and irrespective of its previous state of operation.

DETAILED DESCRIPTION

Figure 1:
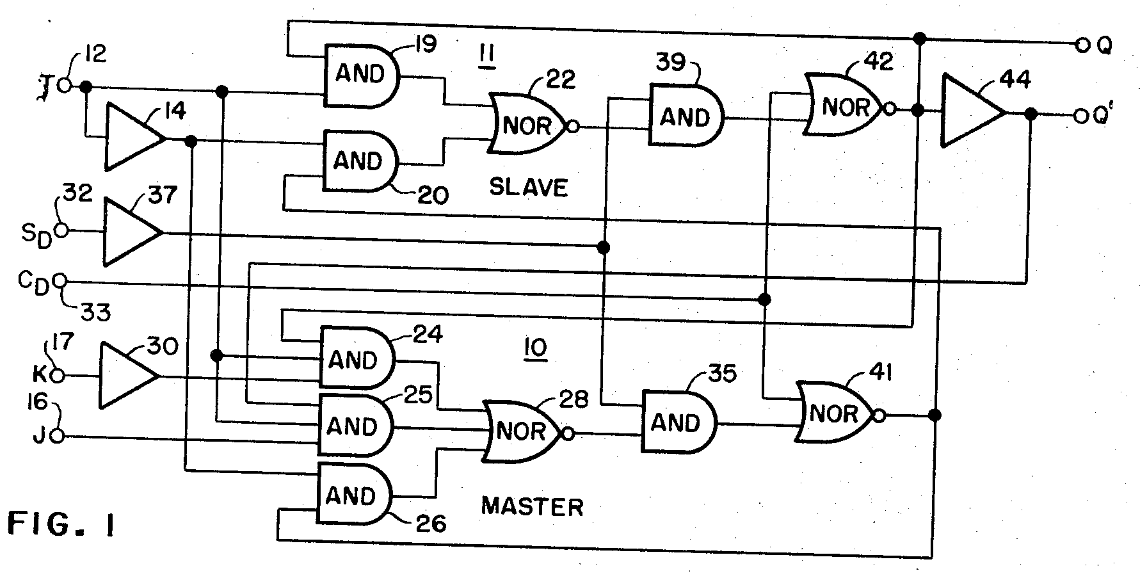
FIG. 1 is a functional circuit block diagram of a preferred embodiment of the invention.

In FIG. 1 there is illustrated a functional block diagram of a circuit according to a preferred embodiment of the present invention. The circuit shown in FIG. 1 is a complete universal J-K flip-flop and essentially comprises two sections, a "master" section 10 and a "slave" section 11. Trigger or toggle signals are applied to an input terminal 12, which is connected directly to some of the inputs of the master and slave sections of the flip-flop and is connected through an inverter 14 to others of the inputs in both sections of the flip-flop. The J and K binary input or bi-level signals of the type commonly applied to such universal J-K flip-flops are applied to input terminals 16 and 17, respectively.

The implementation of the master/slave flip-flop functions is accomplished by a combinational logic circuit including AND gates, NOR gates, and inverters. In the discussion of the operation of the circuit of FIG. 1, and in the subsequent discussion of the detailed circuit diagrams of FIGS. 2, 4 and 5, a positive true logic definition is assumed. Specifically, a "high" voltage or current level is considered a logical or binary 1 while a low voltage or current level is considered a logical or binary 0. The operation of the inverters disclosed in FIG. 1 are standard, with the circuits causing a high input to be inverted to a low output and vice-versa.

When all of the inputs to any of the AND gates shown in FIG. 1 are high, the output of such a gate is high. If, however, any one of the inputs to one of the AND gates is low, the output of that gate is low. If any one of the inputs to a NOR gate is high, the output of that gate is low; but if all of the inputs to a NOR gate are low, the output is high.

The slave section 11 of the flip-flop circuit shown in FIG. 1 comprises a pair of dual-input AND gates 19 and 20, the outputs of which are applied to the two inputs of a NOR gate 22. In the master section 10, three AND gates 24, 25 and 26 each supply an output signal to a NOR gate 28, the output of which is utilized as the output of the master section 10. Input signals appearing on the J input terminal 16 are applied to a first input of the AND gate 25. Similarly, input signals applied to the K input terminal 17 are applied through an inverter 30 to a first input of the AND gate 24. The inverter 30 is used so that the implementation of the circuit using complementary MOS transistors as shown in the detailed circuit diagram of FIG. 2 will respond to conventional J and K signal inputs. The trigger or toggle input signals on the terminal 12 are applied directly to a first input of the AND gate 19 and to second inputs of both the AND gates 24 and 25. Similarly, the input signals on the terminal 12, after being inverted by the inverter 14, are applied to a first input of the AND gate 20 and to a first input of the AND gate 26.

The circuit shown in FIG. 1 also has a provision for operating from direct set and direct reset inputs, which are indicated as the SD input terminal 32 and the CD input terminal 33. In order to implement these asynchronous direct set and reset inputs, an additional AND gate and NOR gate is employed in each of the master and slave sections 10 and 11. In the master section, a dual input AND gate 35 is supplied through an inverter 37 with inverted direct set signals applied to the terminal 32. Similarly, these same inverted signals are applied to a dual input AND gate 39 in the slave section. The second input of the AND gate 35 constitutes the output of the NOR gate 28, and the second input of the AND gate 39 is the output of the NOR gate 22. The outputs of each of the AND gates 35 and 39 then are applied as first inputs to respective NOR gates 41 and 42.

The direct reset or clear terminal 33 is connected directly to second inputs of each of the NOR gates 41 and 42. The output of the NOR gate 42 constitutes the normal or Q output of the flip-flop and is applied directly to a second input of the AND gate 19 in the slave section 11 and to a third input of the AND gate 24 in the master section 10. The output also is inverted by an inverter 44, the output of which comprises the inverted or Q' output of the flip-flop and is applied to a third input of the AND gate 25 in the master section 10. The output signals from the NOR gate 41, in the master section, are applied to the second inputs of the AND gate 20 in the slave section 11 and the AND gate 26 in the master section 10.

The circuit shown in FIG. 1 is operable as a universal J-K flip-flop which is set to either the J or K state in accordance with input signals present on the terminals 16 and 17 upon the application of trigger signals to the terminal 12. In addition, the flip-flop can be operated as a toggle flip-flop when both the J and K inputs are high. Finally, the flip-flop has provisions both high for directly setting it to the Q or Q' output by the application of asynchronous direct set and direct clear or reset signals on the terminals 32 and 33, respectively.

For the purpose of analyzing the operation of the flip-flop circuit shown in FIG. 1, assume initially that the direct set and direct reset signals applied to the terminals 32 and 33 both are low. When this occurs, the inverter 37 inverts the low signal on the terminal 32 to a high signal to enable both of the AND gates 35 and 39. Similarly, the low signal present on the terminal 33 enables the NOR gates 41 and 42.

Thus, the gates 35 and 41 effectively act to invert and pass the output signals from the NOR gate 28; and the AND gate 39 and NOR gate 42 act to invert and pass the output signals from the NOR gate 22.

Figure 3:
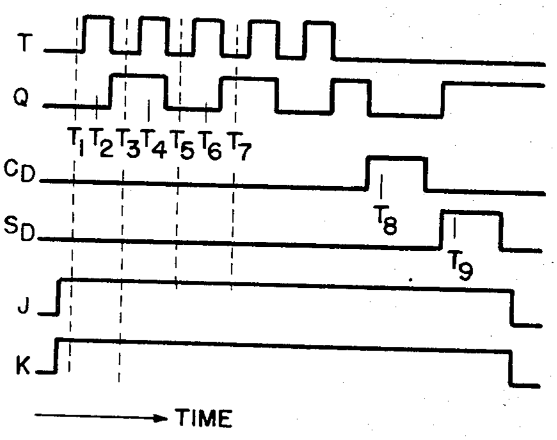
FIG. 3 shows waveforms useful in describing the operation of the device shown in FIGS. 1 and 2.

The trigger signal supplied to the terminal 12 is illustrated in FIG. 3 as the square voltage waveform identified as T. This signal is shown as making very fast transitions between low and high voltage levels, and it is understood that the output of the inverter 14 constitutes the inverse of the signal T of FIG. 3. For the purpose of the initial analysis also assume that both the J and K inputs applied to the terminals 16 and 17 are high, as shown in lines J and K in FIG. 3. This causes the AND gate 25 to be enabled by the high input on the terminal 16. The inverter 30 causes a low input to be applied to the AND gate 24, thereby disabling this AND gate, causing its output to be held low. This in turn enables the NOR gate 28 to respond to the outputs of the AND gates 25 and 26.

With the inputs defined above applied to the terminals 16, 17, 32 and 33, the circuit responds to the trigger or toggle signal on the terminal 12 to produce the output Q as shown in FIG. 3. Operated in this manner, the circuit functions as a toggle flip-flop.

The analysis of the operation in the circuit is considered at nine different time periods which are identified in FIG. 3 as T1 to T9, respectively. The analysis of the operation of FIG. 1 is considered in conjunction with the waveforms shown in FIG. 3 at these different time periods. The output signal Q at the output of the NOR gate 42 and the inverse output Q' from the inverter 44, are in either one or the other of two stable states. For the purposes of initially analyzing the operation of the circuit, it is assumed that the output Q of the NOR gate 42 initially is low and that the inverse output signal Q' at the output of the inverter 44 initially is high. Also, the output from the NOR gate 41 in the master section 10 can also be high or low; and for the purposes of this description, this output initially is considered to be low.

With these initial conditions at time T1, the trigger or clock signal on the terminal 12 is low. Thus, both of the inputs to the AND gate 19 are low. One of the inputs to the AND gate 20 is low, so that both outputs of these gates are low causing a high output to be obtained from the output of the NOR gate 22. This in turn results in two high inputs at the AND gate 39 causing a high output to be obtained therefrom, which in turn results in the output of the NOR gate 42 being low. This satisfies the initial starting conditions.

Since the output of the inverter 30 for the assumed conditions always is low, the AND gate 24 need not be considered for this initial analysis since its output then continuously enables the NOR gate 28 with a low output. At time period T1, the low input on terminal 12 causes the output of the AND gate 25 to be low and the low output from the NOR gate 41 causes the output of the AND gate 26 to be low. Thus, all of the inputs to the NOR gate 28 are low; its output is high, causing the output of the AND gate 35 to be high. This in turn results in the output of the NOR gate 41 being low, also satisfying the initial conditions.

At time period T2, the trigger signal on terminal 12 is high. This causes a low signal to be applied to one of the inputs of each of the AND gates 20 and 26, thereby causing their outputs to remain low. The input to the AND gate 19 obtained from the output of the NOR gate 42 remains low, so that the state of operation of the slave section 11 does not change. The high input applied to the AND gate 25, however, from the terminal 12, causes a high output to be obtained therefrom since both of the other inputs to this AND gate are high at time T2. This in turn reverses the output condition from the NOR gate 41 from low to high. This causes the AND gate 20, in the slave section to be enabled preparing it for the transfer of information from the master section 10 to the slave section 11.

In time period T3, the input signal on the terminal 12 has switched back from a high to a low condition. When this occurs the output of the inverter 14 becomes high, resulting in both inputs to the AND gate 20 being high. This causes the output of the NOR gate 22 to become low and that of the NOR gate 42 to become high, reversing the Q output from a low to a high state, as shown in the Q waveform of FIG. 3 at time interval T3. Thus, the output of the slave section 11 changes from a low stable state to a high stable state one-half cycle of the input waveform applied to the terminal 12 after the change of state in the master section 10. When the Q output, at the output of the NOR gate 42 becomes high, the AND gate 19 is enabled to cause the Q output to be held high when the input trigger signal on the terminal 12 next reverts from a low to a high state. During time period T3, the low output from the inverter 44 applied to an input of the AND gate 25 causes the output of the AND gate 25 to be held low until the next change of state of the output of the slave section 11.

At the fourth analysis time period T4, the trigger signal once again goes high. This high input applied to the AND gate 19 causes its output to become high; thereby holding the output of the NOR gate 22 low which results in a high output continuing to be obtained from the output of the NOR gate 42. In the master section, however, the inverted trigger signal of the output of the inverter 14 results in a low input applied to the AND gate 26; so that the outputs of all of the AND gates 24, 25 and 26 become low, causing the output of the NOR gate 28 to become high. As explained previously, this results in a low output from the NOR gate 41. Thus, the new input information for operation of the flip-flop in its toggle mode now is stored in the master section.

At the time period T5, the input trigger signal on the terminal 12 once again has become low. When this signal goes low, the outputs of both AND gates 19 and 20 then are low since low inputs are applied to at least one input of each of these AND gates. The output of the NOR gate 22 then becomes high, resulting in a low output from the NOR gate 42. The flip-flop then changes to its second or low Q stable state as shown in waveform Q of FIG. 3. When this occurs, the output of the inverter 44 becomes high; thereby preparing the input of the AND gate 25 for receipt of the next high trigger signal.

At time period T6, the signal on the terminal 12 once again becomes high so that at this time all three inputs to the AND gate 25 become high resulting in a high output from that AND gate. This in turn causes the output of the NOR gate 28 to go low which results in the output of the NOR gate 41 going high.

At time period T7, the trigger input signals revert from a high to a low state causing a high output to be obtained from the inverter 14. This causes a high output to be obtained from the AND gate 20 which is enabled by the output of the NOR gate 41 and results in a low output from the NOR gate 22. This causes both inputs to the NOR gate 42 to be low resulting in a high Q output therefrom at time T7.

Further operation of the circuit by continued application of the clock signals results in a repetition of the sequence which has been described.

Assume now that trigger signals cease to be applied to the input terminal 12 and that it remains low, as indicated in the T waveform of FIG. 3 on the righthand portion. If it is desired to then clear the flip-flop or set it to a state where it assumes a low output on the Q output and a high output on the Q′ output, a positive clear pulse is applied to the terminal 33. This pulse is an asynchronous pulse and can be applied at any time irrespective of the other states of operation of the flip-flop circuit. When a high signal is applied to terminal 33, the outputs of both NOR gates 41 and 42 are forced to their low states irrespective of the previous state of operation of the circuit. The feedback signals from the NOR gate 42 then cause low inputs to be applied to the AND gate 24 in the master section and the AND gate 19 in the slave section. At the same time, the low output from the NOR gate 41 is applied to the AND gate 20 in the slave section; thereby causing both outputs of the AND gate 19 and 20 to be low so that the output of the NOR gate 22 is high. Thus, the output of the AND gate 39 is high, holding the NOR gate output 42 low even after removal of the high clear pulse from the terminal 33. The circuit will remain in this state of operation until the further application of trigger pulses on the terminal 12 or until the application of a direct set high pulse on the terminal 32.

If it is desired to asynchronously set the flip-flop to its state where the Q output is high and the Q′ output is low, a high direct set pulse is applied to the terminal 32, as shown at time period T9. The inverter 37 inverts this pulse to a low pulse; thereby disabling both AND gates 35 and 39 causing low outputs to be obtained therefrom. At the time that a direct set pulse is applied to the terminal 32, the signal on the terminal 33 is low; so that both inputs to the NOR gates 41 and 42 then are low, resulting in high outputs from both of these gates. These high inputs applied to the inputs of the AND gates 19 and 20 then result in the output of one or the other of these gates being high dependent upon the state of the signal on the input terminal 12. With either of the outputs of the AND gates 19 or 20 being high, the output of the NOR gate 22 becomes low; so that the output of the AND gate 39 is held low causing the output of the NOR gate 42 to remain high even after the high direct set pulse is removed from the terminal 32. The circuit remains in this state of operation until a clear pulse is applied to the terminal 33 or until additional trigger pulses are applied to the terminal 12.

Assume now that the flip-flop circuit is to be operated as a J-K flip-flop. The initial condition of low signals on the terminals 32 and 33 again is assumed. For the purpose of this illustration, initially assume that the signal on the K terminal 17 is low and the input signal on the J terminal 16 is high. This is the condition of operation which exists when it is desired to set a flip-flop to its high Q state in synchronism with the application of trigger signals applied to the terminal 12. If such synchronous setting of the flip-flop is not desired, the same end result can be accomplished, as described above, by applying a direct set input signal to the terminal 32.

When the K input on the terminal 17 is low and the J input on the terminal 16 is high, both of the AND gates 24 and 25 are enabled since the inverter 30 causes a high input to be applied to the AND gate 24. Assume an initial state of operation where the output of the slave section is such that the NOR gate output 42 is low and the output of the inverter 44 is high. When this occurs, the AND gate 24 produces a low output enabling the NOR gate 28. At the same time the AND gate 25 is enabled by the high output from the inverter 44 and the high input applied to the terminal 16. Also, for the purposes of this initial analysis, assume that the input signal on the terminal 12 initially is low, and that the output signal of the NOR gate 41 also is low. When the clock or trigger signal on the terminal 12 next becomes high, the AND gate 25 produces a high output. As described previously, this causes the output of the NOR gate 28 to become low, resulting in the output of the NOR gate 41 then becoming high enabling both of the AND gates 20 and 26.

As the next half cycle of the trigger input signal, the signal on the terminal 12 becomes low causing the output of the inverter 14 to become high resulting in the output of the AND gate 20 also becoming high. This in turn causes the output of the NOR gate 22 to become low which, as described previously, results in the output of the NOR gate 42 becoming high. The flip-flop thus has been set to its high Q state in accordance with the application of the input signal on the terminal 16. At the same time, the output of the NOR gate 41 remains held high by the high input supplied to both inputs of the AND gate 26 which caused the output of the NOR gate 28 to remain low. At the next half cycle of the input waveform applied to the terminal 12, the high input applied to the AND gate 19 causes a high output to be obtained therefrom which maintains the output of the NOR gate 22 in a low state so that the high Q output at the NOR gate 42 remains. At the same time, a high output is obtained from the AND gate 24 which is enabled by the output of the inverter 30 and the output of the NOR gate 42 so that the NOR gate 28 output remains high. This causes the output of the NOR gate 41 to remain high.

Thus, when the next succeeding half cycle of the trigger waveform on the terminal 12 occurs with a low signal applied thereto, the AND gate 20 continues to apply a high input to the NOR gate 11; so that the flip-flop does not change state. So long as the input conditions remain with a high input on terminal 16 and a low input on terminal 17, the output of the flip-flop continues to be a steady high output for the Q output, irrespective of the state of the clock signals which continue to be applied to the terminal 12.

Now assume that it is desired to set the flip-flop to a high output on the Q′ output (from inverter 44) in synchronism with the trigger or clock signals applied to the terminal 12. The initial condition of low inputs on terminals 32 and 33 again is assumed. Also, assume that an initial condition exits with the Q output of the flip-flop, the output of the NOR gate 42, high and the output of the inverter 44 low. To set the flip-flop synchronously to its stable condition with Q′ high, a high input signal is supplied to the terminal 17 while a low input signal is applied to the terminal 16. The action of the inverter 30 causes a low input signal to be applied to the input of the AND gate 24 from the terminal 17 and the low signal applied to the terminal 16 is applied to the AND gate 25. Thus, both of the AND gates 24 and 25 continuously apply low inputs to the NOR gate 28; thereby enabling the NOR gate 28 to respond to the output of the AND gate 26.

Again assume for the initial condition of operation that the output of the NOR gate 41 is low and that the starting condition of the signal on the terminal 12 also is low. With this starting condition, the NOR gate 28 is supplied with low inputs at all three inputs to produce a high output and the starting condition is satisfied.

With the change of state of the input clock signal from low to high, the output of the inverter 14 becomes low causes both inputs to the AND gate 26 to be low so that no change of state occurs in the master flip-flop section 10. In the slave flip-flop section, however, both inputs to the AND gate 19 are high at this time; so that the output of the AND gate 19 becomes high, forcing the output of the NOR gate 22 to become low. This results in a low output from the AND gate 39 which causes the output of the NOR gate 42 to remain high.

The next half cycle of the input trigger signal then occurs when it becomes low; and once again, there is no change of state of the master flip-flop section 10. When the input on terminal 12 becomes low, both AND gates 19 and 20 have at least one low input applied thereto so that both of the outputs of these AND gates become low. This results in a high output from the NOR gate 22 which in turn results in a high output from the AND gate 39 causing the output of the NOR gate 42 to change state from high to low. This in turn results in a high output from the inverter 44.

The low signal fed back from the output of the NOR gate 42 to one input of the AND gate 19 then renders the AND gate 19 insensitive to any further input trigger pulses on the terminal 12. At the same time, the output from the NOR gate 41 remains low since the AND gate 25 is rendered insensitive to the output of the inverter 44 as a result of the low input signals on the terminal 16. Thus, one of the inputs to each of the AND gates 19 and 20 remains low, causing both of these AND gates to be insensitive to the input trigger pulses so long as a high input signal is applied to the K terminal 17 and a low input signal is applied to the J terminal 16.

Irrespective of the conditions of the signals on the J and K terminals 16 and 17, application of positive pulses on either of the terminals 32 and 33 at any time will result in an asynchronous setting of the flip-flop to the condition described previously for the application of pulses to the terminals 32 and 33.

Figure 2:
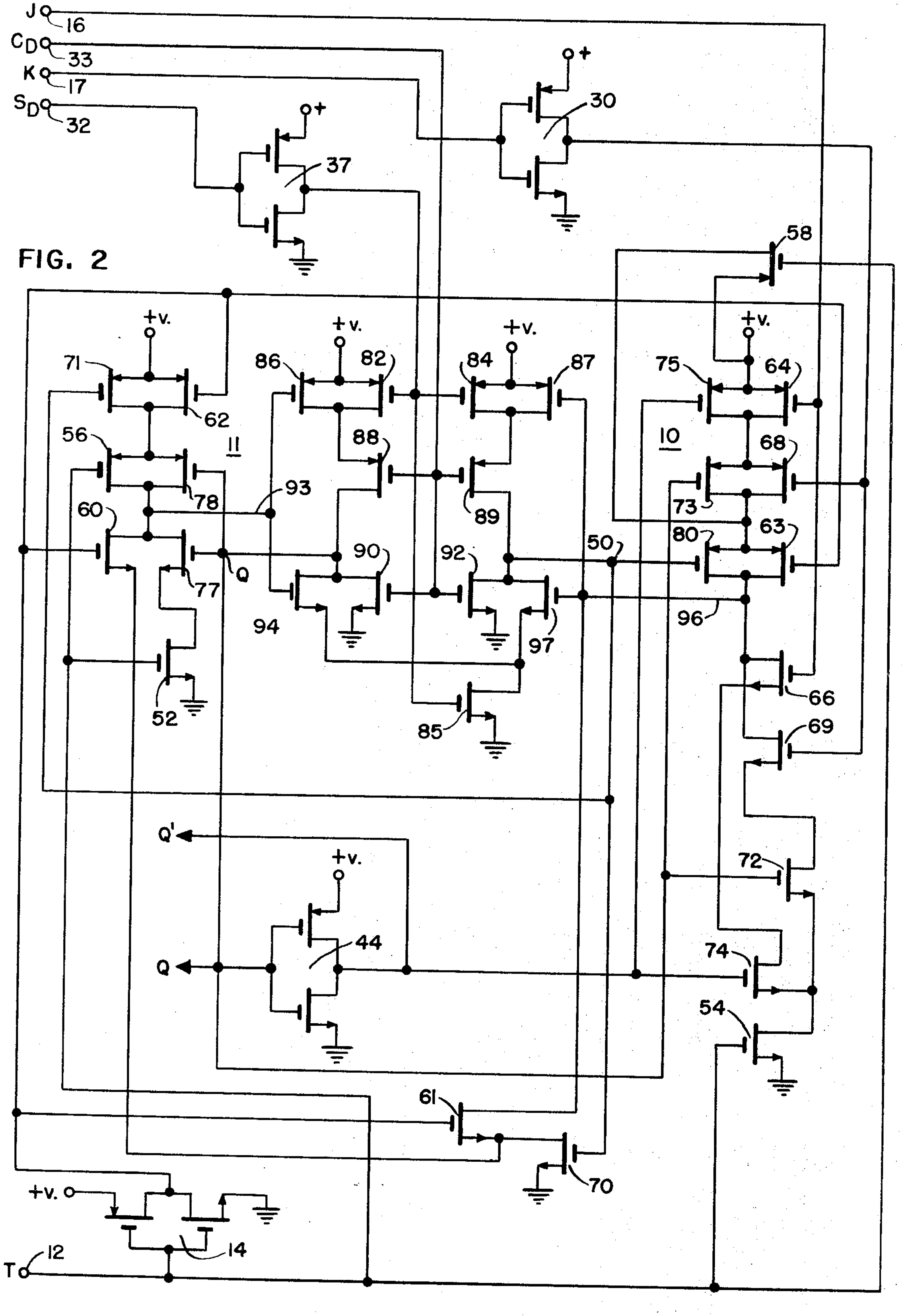
FIG. 2 is a detailed schematic diagram of the circuit shown in FIG. 1.

The combinational logic circuit of FIG. 1 is implemented in accordance with a preferred embodiment of the invention by using a plurality of insulated gate field effect transistors (IGFETs) of complementary or both conduction types, that is, P-channel and N-channel. The circuit of FIG. 2 is comprised of the same two sections, master and slave, as are present in the logic block circuit of FIG. 1. The separate gates of these two sections, however, are not clearly defined in FIG. 2 because several transistors perform a dual function in both the master and slave sections. This is one of the reasons that the circuit shown in FIG. 2 requires a reduced number of transistors and which further results in lower power consumption for the circuit than for comparable universal flip-flop circuits.

Figure 5:
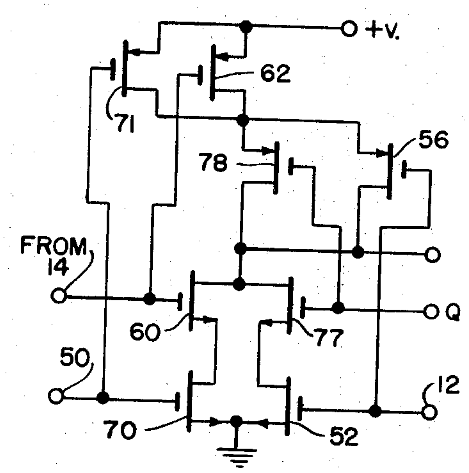
FIGS. 4 and 5 are schematic circuit diagrams of the portions of the circuit shown in FIG. 2 utilized to perform the master and slave circuit operations, respectively.
Figure 4:
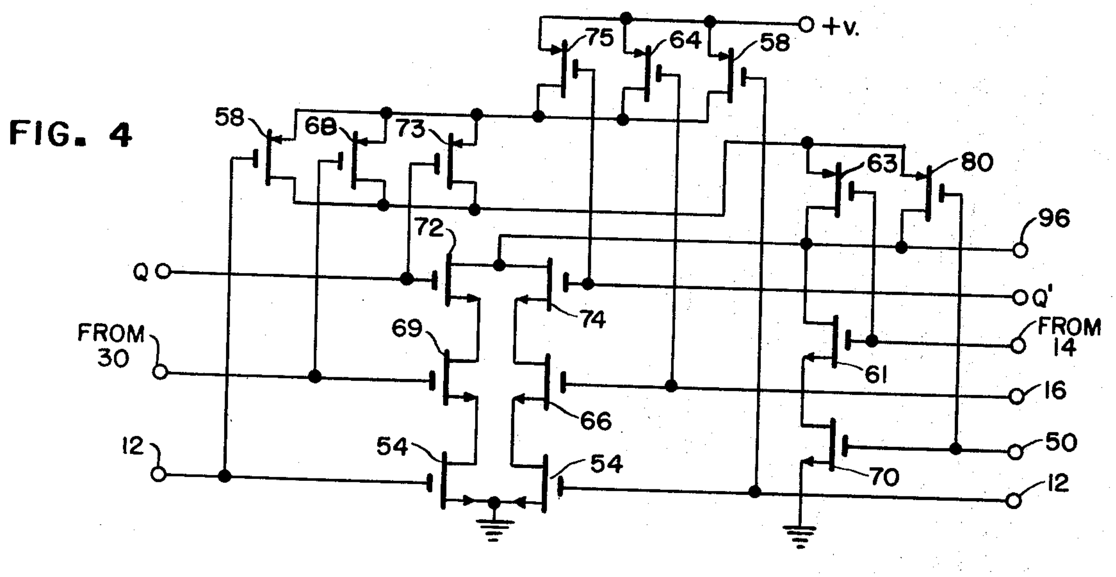

To enable a better understanding of the duality of the functions of some of these transistors, however, part of the circuit shown in FIG. 2 is broken into sections in FIGS. 4 and 5. The circuit of FIG. 4 comprises the master section 10 of the flip-flop for performing the function of gates 24, 25, 26 and 28. Similarly, the circuit of FIG. 5 comprises that portion of the slave section of the flip-flop comprising the gates 19, 20 and 22. The same reference numbers are used in FIGS. 2, 4 and 5 for the same or similar transistors. It can be seen that transistors of the same number appear in both FIGS. 4 and 5. These transistors in the circuit of FIG. 2 appear, of course, only once but are shown in both FIGS. 4 and 5 to illustrate the dual manner of operation of these particular transistors.

In the analysis of the circuit of FIG. 2, it is to be understood that an N-channel device is turned "on," that is, is capable of passing current from drain to source if the voltage at the gate of the transistor is more positive than the voltage at the source by at least an amount equal to the threshold voltage. Similarly, a P-channel transistor is on, that is, capable of passing current from source to drain if the gate voltage is more negative than the source voltage by at least an amount equal to the threshold voltage.

At all times in the circuit shown in FIG. 2, P-channel devices are turned on by causing the voltage at the source terminal to be substantially equal to the positive supply voltage +V and the voltage at the gate terminal to be equal to substantially ground level or zero volts. Similarly, N-channel devices are turned on by causing the voltage at the source terminal to be substantially equal to ground level or zero volts and the voltage at the gate terminal to be substantially equal to the positive supply voltage +V. For the purposes of this description, it is assumed that the supply voltage is at least twice the magnitude of the threshold voltage and that the threshold voltages of the P and N channel devices are approximately equal.

The clock or trigger signal applied to terminal 12 of the circuit shown in FIG. 2 is the same as the corresponding clock signal applied to the same terminal in FIG. 1. When reference is made to a high condition of this signal, it is used here to mean that the input signal is caused to have a value substantially equal to +V volts. Similarly, when the input signal is caused to become low, the signal is substantially zero volts or ground potential. In order to avoid complicating the circuit of FIG. 2, the positive or +V supply terminal has not been shown as a single terminal but is identified at various parts of this circuit by the designation +V. This terminal in actual practice would constitute a single terminal. Similarly, the other terminal of the voltage supply is ground terminal, which is shown at several parts of the circuit in FIG. 2. It is understood that the ground terminal is interconnected throughout the circuit, as is the +V terminal.

The inverters 14, 30, 37 and 44 of FIG. 1 are indicated by the same reference numbers in FIG. 2. These inverters all include a pair of opposite conductivity transistors, with the gates connected to a common input. The source of the P-channel transistor in each of these inverters is connected to the +V supply terminal and the source of the N-channel transistor is connected to ground. The drains of the transistors are interconnected to form the output of the inverter. Whenever the input signal applied to the gates of such an inverter pair of transistors is high, the common drain connection of the transistors goes low and vice-versa.

In analyzing the operation of the circuit shown in FIG. 2, the waveforms of FIG. 3 once again are useful, and the same analysis time periods which were considered in the description of the operation of FIG. 1 also are used. Initially, assume that the input signals on both the J and the K terminals 16 and 17 are high as shown in FIG. 3. This causes the output of the inverter 30 to be low as described above.

Also, for the initial consideration, the input signals applied to the direct set and direct clear terminals 32 and 33 both are low, the initial state of the Q output is low, the Q' output is high, and the trigger signal at time period T1 on terminal 12 is low, causing a high output to be obtained from the inverter 14. The output of the NOR gate 41 also initially is assumed low, and this output appears at a junction 50 in FIG. 2.

With these initial starting conditions of the circuit, the low signal on the terminal 12 biases two N-channel transistors 52 and 54 off, since their gates and sources are both low. At the same time, the low input on the terminal 12 biases on a pair of P-channel transistors 56 and 58 in the slave and master sections 11 and 10 respectively. This occurs since the sources of these P-channel devices are connected to the positive voltage supply +V while their gates are held at near ground potential by the low signal on the terminal 12. The inverted signal from the output of the inverter circuit 14 is a high signal at this time and biases a pair of N-channel transistors 60 and 61 on, while at the same time biasing off a pair of P-channel transistors 62 and 63, located in the slave and master sections 11 and 10 respectively.

At time period T1, the high signal appearing on J input terminal 16 biases off a P-channel transistor 64 in the master section 10 and simultaneously biases an N-channel transistor 66 on. Similarly, the inverted K signal, present on the terminal 17, appearing at the output of the inverter 30 is low and biases a P-channel transistor 68 on and an N-channel transistor 69 off.

The low signal appearing at the junction 50 at the output of the master section 11 of the flip-flop biases off an N-channel transistor 70 shared by both master and slave sections, and biases a P-channel transistor 71 in the slave section 11 on. The low signal present at the terminal 50 also is fed back to the gate of a P-channel transistor 80 in the master section 10 to cause that transistor to be turned on.

The low signal on the Q output of the slave section 11 of the flip-flop biases off an N-channel transistor 72 in the master section and biases on a P-channel transistor 73 in the same section. The low Q output in the slave section 11 is fed back to that same section to bias off an N-channel transistor 77 and to bias on a P-channel transistor 78. The inverted Q' output of the slave section is high at this time and biases on an N-channel transistor 74, the source of which is connected in common with the source of the transistor 72 to the drain of the transistor 54 in the master section. At the same time, a P-channel transistor 75 is biased off by the high Q' output fed back to the master section 10 from the slave section 11.

The transistors comprising the AND gates 35 and 39 and the NOR gates 41 and 42 of FIG. 1, are located in the center of the circuit diagram shown in FIG. 2, and the inputs on the terminals 32 and 33 are applied to these gates. The low signal assumed to be present on the input terminal 32 is inverted by the inverter 37 to a high signal to bias off a pair of P-channel transistors 82 and 84, the sources of which are connected to the supply terminal. A second P-channel transistor 86 has its source and drain connected in parallel with the transistors 82 and a second P-channel transistor 87 has its source and drain connected in parallel with the transistor 84. The high signal present at the output of the inverter 37 is also applied to the gate of an N-channel transistor 85 to bias that transistor into conduction.

The low input signals present on the direct clear input 33 are applied to a pair of P-channel transistors 88 and 89 to bias on these transistors. The source of the transistor 88 is connected to the common connected drains of the transistors 82 and 86, and the source of the transistor 89 is connected to the common connected drains of the transistors 84 and 87, thereby permitting output signals to pass from each of these parallel connected pairs through the drains of the transistors 88 and 89 respectively. The low signals present on the terminal 33 also are applied to the gates of a pair of N-channel transistors 90 and 92 to bias these transistors off. The sources of the transistors 90 and 92 are connected to ground and the drains of these transistors are connected respectively to the drains of the P-channel transistors 88 and 89.

The output of the slave section 11 of the flip-flop is applied over a lead 93 to the gate of the P-channel transistor 86 and to the gate of an N-channel transistor 94. For the assumed state of conditions, the output on this lead 93 initially is high since the transistors 52 and 70 both are off and the transistors 71, 56 and 78 are on, resulting in essentially +V potential on the lead 93. Thus, the transistor 86 is turned off and the transistor 94 is turned on. The output of the master section 10 appearing on a lead 96 also is high at this time and this output biases a P-channel transistor 87 off and biases an N-channel transistor 97 on.

To summarize the state of the circuits during time period T1, the transistors 56, 58, 60, 61, 66, 68, 71, 73, 74, 78, 80, 85, 88, 89, 94 and 97 are on while the transistors 52, 54, 62, 63, 64, 69, 70, 72, 75, 77, 82, 84, 86, 87, 90 and 92 are off.

For the second time period T2, the only change of signal at the input terminals to the circuit occurs on the trigger or clock input terminal 12, which now changes from a low to a high state. This in turn causes the output of the inverter 14 to go from a high to a low state. To determine the effect of this transistion, the transistors connected directly to the input terminal 12 and the output of the inverter 14 first must be investigated. From this it can be seen that the transistors 52 and 54 are turned on since they are N-channel devices and their gates go high because these gates are connected directly to the terminal 12. At the same time, the transistors 56 and 58 are turned off since they are P-channel transistors, the gates of which are connected to this same terminal. The N-channel transistors 60 and 61, which previously were on, now are turned off and the P-channel transistors 62 and 63, which previously were off, now are turned on.

Since the transistor 74 remains on because its gate level has not changed, the source of the N-channel transistor 66 now is connected substantially to ground through the drain source paths of the on transistors 54 and 74. The gate level of the transistor 66 has not changed and is high for the assumed conditions, so that the output level on the lead 96 connected to the drain of the transistor 66 changes from high to low due to the fact that the N-channel transistor 61, which also is connected to the lead 96, now is off. The P-channel transistors 64 and 75 with parallel connected drain source paths between the +V terminal and the common sources of the transistors 68 and 73 both are off preventing any +V from appearing on the lead 96.

When the signal on the lead 96 goes low, the N-channel as stated 97 is turned off and the P-channel transistor 87 is turned on. This causes the terminal 50 to change from low to high because +V is applied through the now on transistor 87 and the already on transistor 89 to the junction 50, and both of the transistors 92 and 97 are off. This high potential at the terminal 50 biases the transistor 80 off in the master section 10 and further biases on the transistor 70 and biases off the transistor 71 in the slave section. Even though the transistor 71 is biased off, the transistor 62, as previously, now is on; so that +V potential appears from the common connected drains of these transistors at the sources of the transistors 56 and 78. Since the transistor 56 now is on, this +V potential continues to appear on the lead 93 maintaining the bias off of the transistor 86 and the bias on of the transistor 94. Since the bias conditions of the transistors 82, 88 and 90 have not changed, the Q output of the circuit as applied to the input of the inverter 44 remains low.

As a result, during time period T2, the transistors 52, 54, 62, 63, 70 and 87, which were off, are turned on; and the transistors 56, 58, 60, 61, 71, 80 and 97, which were on, are turned off. The output signal does not change state, but the signal at the terminal 50 goes from low to high. This is consistent with the operation previously described for FIG. 1 and shown in the waveforms of FIG. 3. There are no other circuit changes during time period T2.

During the third time period T3, the input signal on the terminal 12 goes from high back to low. The circuit changes again initiate with the transistors which are tied directly to the input signal lines. The transistors 52 and 54, which were on, go off. The transistors 56 and 58, which were off, go on. The transistors 60 and 61, which were off, go on, and the transistors 62 and 63, which were on, go off.

With the transistor 54 off, the common source connection of the transistors 71 and 74 become substantially open-circuited. The drains of these transistors connected to the sources of the transistors 66 and 69 respectively, therefore reflect this same open circuit to the junction of the drains of the transistors 66 and 69 at the output lead 96 of the master section. The output lead 96, however, is maintained low through the series connected drain source paths of the transistors 61 and 70, both of which are on at this time to apply substantially ground potential to the lead 96. Thus, the P-channel transistor 87 is maintained on and the N-channel transistor 97 is maintained off. Since the P-channel transistor 89 is continuously maintained on by the low potential on the terminal 33 and further since the transistor 92 is maintained off by this same potential, a high potential continues to be present on the output terminal 50, maintaining the transistor 70 on and the P-channel transistors 71 and 80 off.

When the N-channel transistor 60 goes on, a path is completed to ground through the drain source path of this transistor and the drain source path of the on N-channel transistor 70. This causes the potential on the lead 93 to go low, turning on the P-channel transistor 86 and turning off the N-channel transistor 94.

When the P-channel transistor 86 goes on, the output Q goes high and the output Q′ goes low. The high Q output biases on the transistor 77 in the slave section and the transistor 72 in the master section and biases off the P-channel transistors 73 in the master section and 78 in the slave section. The Q′ output, which now is low, biases off the N-channel transistor 74 and biases on the P-channel transistor 75 preparing the master section for the next clock pulse.

Thus, during the third time period T3, the transistors 52, 54, 62, 63, 73, 74, 78 and 94, which were on turn off; while the transistors 56, 58, 60, 61, 72, 75, 77 and 86, which were off, are turned on. No other circuit changes occur; and the output signals Q and Q′ reverse, with Q going high and Q′ going low.

During the fourth time period, the input signal on the terminal 12 once again goes high. The transistors 52 and 54 are turned on and the transistors 56 and 58 are turned off. Similarly, the transistors 60 and 61 are turned off and the transistors 62 and 63 are turned on. When the transistor 61 goes off, the path to ground from the lead 96 is broken. Since the transistors 69 and 74 also are off at this time because of the low signals applied to the gates of these transistors, there is no path completed to ground for the lead 96. With the transistors 75, 68 and 63 on, however, a path is completed from the +V terminal to the lead 96, which then goes high. This in turn biases on the transistors 97 and biases off the transistor 87 to cause a low output to appear at the terminal 50. This low potential on the terminal 50 turns off the transistor 70 and turns on the transistor 71 in the slave section 11. At the same time, the P-channel transistor 80 in the master section is turned on. Since the transistors 52 and 77 both are on the potential on the lead 93 remains low and there is no change in the Q and Q′ outputs of the circuit.

In summary, during time period T4, the transistors 52, 54, 62, 63, 71, 80 and 97, which previously were off, are now on; and the transistors 56, 58, 60, 61, 70 and 87, which were on, are now off.

During the fifth time period T5, the input signal on the terminal 12 once again goes from high to low as described previously. This causes the transistors 52 and 54, which were on, to go off; the transistors 56 and 58, which were off, to go on; the transistors 60 and 61, which were off, to go on; and the transistors 62 and 63, which were on, to go off. With the transistors 54 going off, no path can be completed from the lead 96 through any of the transistors 66, 69, 72 and 74 to ground. At the same time, the transistor 70 is off so that no path is completed to ground through the transistor 61. The lead 96 is coupled essentially to +V potential through the on transistors 80 and 58 so that it continues to apply a high potential to the gates of the transistors 97 and 87, biasing the transistor 97 on and the transistor 87 off. As stated previously, this causes the potential on the terminal 60 to remain low.

The low potential on the terminal 50 applied to the gate of the P-channel transistor 71 causes that transistor to be maintained on. Since the transistor 56 also now is on, a high potential appears on the lead 93. This reverses the bias on the transistors 86 and 94, causing the transistor 94 to be turned on and causing the transistor 86 to be turned off. As a result, substantially ground potential is applied through the source drain path of the transistor 94 and the source drain path of the transistor 85 to the output terminal Q causing Q to go low and causing the Q′ output to go high. This in turn as stated previously, causes the P-channel transistor 78 to go on, the N-channel transistor 77 to go off, the N-channel transistor 72 to go off, and the P-channel transistor 73 to go on. The Q′ output, which now is high, causes the N-channel transistor 74 to go on and the P-channel transistor 75 to go off.

As a consequence, during the fifth time period, the transistors 52, 54, 62, 63, 72, 75, 77 and 86, which were on, go off; and the transistors 56, 58, 60, 61, 73, 74, 78 and 94, which were off, go on. No other circuit changes occur, and the output signals Q and Q′ change with Q going low and Q′ going high.

From the foregoing, it can be seen that at the end of time period T5, the circuit of FIG. 2 is in the same condition as it was in the initial time period T1. As a consequence, during time period T6, the conductivities of the various transistors in the circuit assume the same state as they did in time period T2. Similarly, in time period T7, the circuit assumes the same conductivity states as in time period T3, etc.

As described previously in conjunction with the block diagram of FIG. 1, there is a provision for direct set (SD) and direct reset (CD) for the circuit. Assume that as indicated in time period T8, it is desired to cause the circuit to be asynchronously reset, with the Q output low and the Q′ output high. For this analysis, the state of the input clock signal on the terminal 12 can be either high or low, and for the present purposes can be considered to be low. When a positive direct reset pulse is applied to the terminal 33, the previously continuously conductive P-channel transistors 88 and 89 are rendered non-conductive; thereby breaking the paths to +V for the terminal 50 and for the Q output terminal. At the same time, the N-channel transistors 90 and 92 are rendered conductive causing a near ground or low potential to be applied to the terminal 50 and to appear on the Q output terminal. Thus, Q is asynchronously set low and Q′ goes high.

The feedback paths from the output terminal 50, in the master section, and the Q output terminal, in the slave section, have been described previously. Low outputs on both of these terminals along with low input on terminal 12 force the circuit to assume a conductivity state with the transistors 56, 58, 60, 61, 66, 68, 71, 73, 74, 78, 80, 85, 90, 92, 94 and 97 on; and the transistors 52, 54, 62, 63, 64, 69, 70, 72, 75, 77, 82, 84, 86, 87, 88 and 89 off.

When the transistors 85, 97 and 94 go on, the circuit maintains this stable state with Q low and Q′ high, even after the signal on the terminal 33 again goes low since ground connection is applied to the terminal 50 through the on transistors 97 and 85 and to the Q output terminal through the on transistors 94 and 85. The circuit remains in this state until a direct set signal is applied to the terminal 32 or until additional trigger signal transistions are applied to the terminal 12.

In a similar manner, when it is desired to directly set the output of the flip-flop to a high Q state and a low Q′ state an asynchronous high input is applied to the terminal 32. This is inverted by the inverter 37 and causes the transistors 82 and 84, which previously are continuously off, to be turned on. At the same time, the transistor 85 is turned off, preventing any low potential from being applied to either the terminal 50 or the Q output terminal. Whenever a direct set input is applied to the terminal 32, the terminal 33 has a low input applied to it; so that the transistors 88 and 89 are on.

A +V potential then is applied to the Q output terminal. This is inverted by the inverter 44 to a low potential on the Q′ output terminal. At the same time, a high potential appears on the terminal 50. Once again by virtue of the feedback connections from the Q and Q′ output terminals and the connections from the terminal 50, which have been described in detail, the state of the flip-flop for time period T9, representative of an asynchronous direct setting of the flip-flop, is as follows.

The transistors 52, 54, 62, 63, 64, 69, 71, 73, 74, 78, 80, 85, 90, 92, 94 and 97 are off. The transistors 56, 58, 60, 61, 66, 68, 70, 72, 75, 77, 82, 84, 86, 87, 88 and 89 are on. When the transistors 86 and 87 are turned on, the path from the Q output terminal to +V and from the terminal 50 to +V is maintained even after the high input on the terminal 32, which initiated the direct asynchronous setting, is removed. The flip-flop will remain in this stable state with Q high and Q′ low until a direct reset signal is applied to the terminal 33 or until further signal transitions are applied to the trigger input terminal 12.

The universal flip-flop of FIG. 2 also operates, as previously described in conjunction with the block diagram in FIG. 1, as a J-K flip-flop. When the flip-flop is operated in this mode, one or the other of the J and K terminals 16 and 17 is high while the other is low. When the J terminal is high and the K terminal is low, high signals are applied to turn off the transistor 64 and to turn on the transistor 66 as in the previous description. The inverter 30, however, also causes high signals to be applied to the gates of the transistors 68 and 69 turning off the P-channel transistor 68 and causing the N-channel transistor 69 to be continuously on. Thus, both of the transistors 66 and 69 remain on at all times and the transistors 64 and 68 remain off at all times. Then when an input binary signal train of alternating high and low binary trigger signal levels is applied to the terminal 12, the signal transitions are such that the circuit is switched to a high Q output in synchronism with the trigger signal, as previously described for FIG. 1, to set the flip-flop to a high Q output and a low Q′ output. Once the circuit assumes this condition of operation, it is maintained in this condition of operation by maintaining continuously a low output on the lead 96 irrespective of the switching of the transistors having their gates connected directly to the terminal 12 or connected to the output of the inverter 14. There is continuously provided a path to ground potential for the lead 96 so long as the J input is high and the K input is low. It is not considered necessary to trace through the sequence of operation, since from the foregoing description of the operation of the circuit in the toggle mode, this readily can be done.

If it is desired to set the circuit synchronously to the reset mode of operation where the Q′ output is high and the Q output is low, a high input is applied to the K input terminal 17 and a low input is applied to the J input terminal 16. This causes a reverse of the conditions for the transistors 64, 68, 66 and 69 from that which existed for the previous condition just described. Now the P-channel transistors 64 and 68 always are conductive to complete a path from +V to the interconnected sources of the transistors 63 and 80; thereby bypassing or shunting the input transistor 58 and rendering it ineffective. At the same time, the transistors 66 and 69 both are supplied with low inputs to their gates rendering them non-conductive and blocking any paths to ground at the common connected drains of these transistors on the lead 96. Then when the transistor 63 is turned on by the input trigger signal from the inverter 14, the condition of operation is reached which sets the flip-flop to the output state with Q′ high and Q low. The feedback circuits from the Q and Q′ output and the terminal 50 maintain the flip-flop set to this state since the lead 96 continuously remains high through a path to +V established by the on P-channel transistors 64, 68 and 80.

I claim:

1. A binary master-slave flip-flop circuit including in combination:

first, second, third, fourth and fifth AND gates each having an output terminal and said first, second and fifth AND gates having at least two input terminals and said third and fourth AND gates having at least three input terminals;

first and second NOR gates, said first NOR gate having at least two input terminals and an output terminal and said second NOR gate having at least three input terminals and an output terminal;

means for connecting the output terminals of said first and second AND gates respectively to the input terminals of said first NOR gate;

means for connecting the output terminals of said third and fourth and fifth AND gates respectively to the input terminals of said second NOR gate;

a first inverter having an input terminal and an output terminal;

first coupling means for coupling the output terminal of said first NOR gate with the input terminal of said first inverter, with a first input terminal of said first AND gate, and with a first input terminal of said third AND gate;

second coupling means for coupling the output terminal of said first inverter, with a first input terminal of said fourth AND gate;

third coupling means for coupling the output terminal of said second NOR gate with a first input terminal of said second AND gate and with a first input terminal of said fifth AND gate;

a second inverter having an input terminal and an output terminal;

means for interconnecting the input terminal of said second inverter with a second input terminal of each of said first, third and fourth AND gates;

means for interconnecting the output terminal of said second inverter with a second input terminal of each of said second fifth AND gates.

2. The combination according to claim 1 further including means for applying a first input signal in the form of a bi-level input pulse train comprising a series of repetitive cycles and each of said cycles including a first time period corresponding to a first binary signal level and a second time period corresponding to a second binary signal level to said means for interconnecting the input terminal of said second inverter with the second input terminals of said first, third and fourth AND gates;

means for applying second bi-level signals to a third input of said third AND gate; and means for applying third bi-level signals to a third input of said fourth AND gate.

3. The combination according to claim 1 wherein said first coupling means comprises a sixth AND gate and a third NOR gate, each having at least two inputs and an output, with a first input of said sixth AND gate connected to the output of said first NOR gate and the output of said sixth AND gate connected to a first input of said third NOR gate, the output of which is connected to the input of said first inverter;

and said third coupling means comprises a seventh AND gate and a fourth NOR gate, each having at least two inputs and an output, with a first input of said seventh AND gate connected to the output of said second NOR gate, the output of said seventh AND gate connected to a first input of said fourth NOR gate, the output of which is connected to the first input of each of said second and fifth AND gates;

means for interconnecting second input terminals of said sixth and seventh AND gates; and means for interconnecting second input terminals of said third and fourth NOR gates.

4. The combination according to claim 3 further including means for applying first signals of either of two binary levels to the interconnected second inputs of said sixth and seventh AND gates; and means for applying second signals of either of two binary levels to the interconnected second inputs of said third and fourth NOR gates.

5. The combination according to claim 4 further including means for applying a third binary bi-level input signal in the form of an input pulse train comprising a series of repetitive cycles, each including a first time period corresponding to a first binary signal level and a second time period corresponding to a second binary signal level to said means for interconnecting the input terminal of said second inverter with the second input terminals of said first, third and fourth AND gates;

means for applying fourth bi-level signals to a third input of said third AND gate; and means for applying fifth bi-level signals to a third input of said fourth AND gate.

6. The combination according to claim 3 wherein said sixth and seventh AND gates and said third and fourth NOR gates are fabricated with field-effect transistors and comprise:

a first voltage supply terminal for supplying a direct current potential having a first potential level;

a second voltage supply terminal for supplying a direct current potential having a second potential level, one of said first and second potential levels being more positive than the other;

a plurality of field-effect transistors of first and second opposite conductivity types, each having source, gate, and drain electrodes, said plurality including:

a first transistor of said second conductivity type having its source connected to said second supply terminal;

second and third transistors of said first conductivity type, the sources thereof being coupled with said first voltage supply terminal and the gates thereof being interconnected in common with the gate of said first transistor;

fourth and fifth transistors of said first conductivity type, the sources and drains of which being respectively connected in parallel with the sources and drains of said second and third transistors;

sixth and seventh transistors of said first conductivity type, the source of said sixth transistor being connected to the drains of said second and fourth transistors, the source of said seventh transistor being connected to the drains of said third and fifth transistors;

eight and ninth transistors of said second conductivity type, the drains thereof being connected together in common with the drain of said sixth transistor, the source of said eighth transistor being connected to the drain of said first transistor, and the source of said ninth transistor being connected to said second supply terminal;

tenth and eleventh transistors of said second conductivity type, the drains thereof being interconnected in common with the drain of said seventh transistor, the source of said eleventh transistor connected to the drain of said first transistor, and the source of said tenth transistor connected to said second supply terminal;

said means for interconnecting second input terminals of said sixth and seventh AND gates comprising means for interconnecting the gates of said first, second and third transistors;

said means for interconnecting second input terminals of said third and fourth NOR gates comprising means for interconnecting the gates of said sixth, seventh, ninth and tenth transistors;

the output of said first NOR gate being connected in common to the gates of said fourth and eighth transistors;

the output of said second NOR gate being connected in common to the gates of said fifth and eleventh transistors; and the output of said third NOR gate being obtained from the interconnected drains of said sixth, eighth and ninth transistors; and the output of said fourth NOR gate being obtained from the interconnected drains of said seventh, tenth and eleventh transistors.

7. The combination according to claim 1 wherein said first and second AND gates and said first NOR gate are fabricated with field-effect transistors and comprise:

a first voltage supply terminal for supplying a direct current potential having a first potential level;

a second voltage supply terminal for supplying a direct current potential having a second potential level, one of said first and second potential levels being more positive than the other;

a plurality of field-effect transistors of first and second opposite conductivity types, each having source, gate, and drain electrodes, said plurality including:

a first field-effect transistor of said first conductivity type, having its source connected to said first supply terminal and having its gate connected to the output of one of said third coupling means and said second inverter;

a second transistor of said second conductivity type having its source connected to said second supply terminal and having its gate connected to the gate of said first transistor;

a third transistor of said second conductivity type having its source connected to said drain of said second transistor and having its gate connected to the output of the other of said second inverter and said third coupling means;

a fourth transistor of said first conductivity type having its gate connected with the gate electrode of said third transistor, having its source connected to said first voltage supply terminal and having its drain connected to a first junction with the drain of said first transistor;

fifth and sixth field-effect transistors of said first conductivity type having the sources thereof coupled in common with said first junction and having the drains thereof coupled in common with the drain of said third transistor;

seventh and eighth field-effect transistors of said second conductivity type, the drain of said seventh transistor coupled in common with the drain of said third transistor, the source of said seventh transistor and the drain of said eighth transistor being interconnected and the source of said eighth transistor connected with said second voltage supply terminal;

means for coupling the output of said first coupling means with the gate one of said fifth and sixth transistors and with the gate of one of seventh and eighth transistors; and means for coupling first binary input signals to the input of said second inverter and to the gate of the other of said fifth and sixth transistors and the gate of the other of said seventh and eighth transistors.

8. The combination according to claim 7 wherein said first potential level is more positive than said second potential level, said transistors of said first conductivity type are P-channel transistors and said transistors of said second conductivity type are N-channel transistors.

9. The combination according to claim 1 wherein said third, fourth and fifth AND gates and said second NOR gate comprise:

a first voltage supply terminal for supplying a direct current potential at a first potential level;

a second voltage supply terminal for supplying a direct current potential at a second level one of said first and second levels of potential being more positive than the other;

a plurality of field-effect transistors of first and second opposite conductivity types each having source, gate and drain electrodes, said plurality including:

first and second transistors of said first conductivity type having the sources thereof coupled in common with said first voltage supply terminal and having the drains thereof coupled in common with a first junction;

third and fourth transistors of said first conductivity type having the sources thereof coupled in common with said first junction and having the drains thereof coupled in common with a second junction;

a fifth transistor of said first conductivity type having the source thereof coupled with said first voltage supply terminal and having the drain thereof coupled with said second junction;

sixth and seventh transistors of said first conductivity type having the sources thereof coupled in common with said second junction and having the drains thereof coupled in common with a third junction;

eighth and ninth transistors of said second conductivity type having the drains thereof coupled in common with said third junction;

a tenth transistor of said second conductivity type having the source thereof coupled in common with said second voltage supply terminal;

eleventh and twelfth transistors of said second conductivity type having the sources thereof coupled respectively to the drain of said tenth transistor and having the drains thereof coupled respectively to the sources of said eighth and nineth transistors;

thirteenth and fourteenth transistors of said second conductivity type, with the source of said thirteenth transistor connected to the drain of said fourtheenth transistor, the drain of said thirteenth transistor connected to said third junction and the source of said fourteenth transistor connected to said second voltage supply terminal;

means for coupling a first source of binary input signals with the input terminal of said second inverter and with the gates of said fifth and tenth transistors;

means for coupling the output of said first coupling means with the gate of one of said third and fourth transistors and with the gate of one of said eighth and eleventh transistors;

means for coupling the output of said first inverter with the gate of one of said first and second transistors and with the gate of one of said ninth and twelfth transistors;

means for coupling the output of said third coupling means with the gate of one of said sixth and seventh transistors and with the gate of one of said thirteenth and fourteenth transistors;

means for coupling the output of said second inverter with the gate of the other of said sixth and seventh transistors and with the gate of the other of said thirteenth and fourteenth transistors;

means for applying first binary control signals to the gate of the other of said third and fourth transistors and to the gate of the other of said eighth and eleventh transistors; and means for applying second binary control signals to the gate of the other of said first and second transistors and to the gate of the other of said ninth and twelfth transistors.

10. The combination according to claim 9 wherein said first potential level is more positive than said second potential level, said transistors of said first conductivity type are P-channel transistors and said transistors of said second conductivity type are N-channel transistors.

11. The combination according to claim 9 wherein said first and second AND gates and said first NOR gate are fabricated with field-effect transistors and comprise:

a plurality of field-effect transistors of first and second opposite conductivity types each having source, gate and drain electrodes, said plurality including:

a fifteenth field-effect transistor of said first conductivity type having its source connected to said first supply terminal, and having its gate connected to the gate of said fourteenth transistors and to the output of one of said third coupling means and said second inverter;

a sixteenth transistor of said second conductivity type, having its source connected to the drain of said fourteenth transistor and having its gate connected to the output of the other of said second inverter and said third coupling means;

a seventeenth transistor of said first conductivity type, having its gate connected with the gate electrode of said sixteenth transistor, having its source connected to said first voltage supply terminal and having its drain connected to a first junction with the drain of said fifteenth transistor;

eighteenth and nineteenth transistors of said first conductivity type, having the sources thereof coupled in common with said first junction, and having the drains thereof coupled in common with the drain of said sixteenth transistor;

twentieth and twenty-first transistors of said second conductivity type, the drain of said twentieth transistor coupled in common with the drain of said sixteenth transistor, the source of said twentieth transistor and the drain of said twenty-first transistor being interconnected, and the source of said twenty-first transistor being connected with said second voltage supply terminal;

means for coupling the output of said first coupling means with the gate of one of said eighteenth and nineteenth transistors and with the gate of one of said twentieth and twenty-first transistors; and means for coupling first binary input signals to the input of said second inverter and with the gate of the other of said eighteenth and nineteenth transistors and with the gate of the other of said twentieth and twenty-first transistors.

* * * * *